United States Patent
Yamashita (10) Patent No.: US 8,680,862 B2
(45) Date of Patent: Mar. 25, 2014

(54) MAGNETIC RESONANCE IMAGING APPARATUS

(75) Inventor: Masatoshi Yamashita, Otawara (JP)

(73) Assignees: Kabushiki Kaisha Toshiba, Tokyo (JP); Toshiba Medical Systems Corporation, Tochigi (JP)

(*) Notice: Subject to any disclaimer, the term of this patent is extended or adjusted under 35 U.S.C. 154(b) by 732 days.

(21) Appl. No.: 12/787,754

(22) Filed: May 26, 2010

(65) Prior Publication Data

US 2010/0301865 A1 Dec. 2, 2010

(30) Foreign Application Priority Data

May 29, 2009 (JP) ................................. 2009-130953
Apr. 15, 2010 (JP) ................................. 2010-094217

(51) Int. Cl.
*G01V 3/00* (2006.01)
*G01R 33/385* (2006.01)

(52) U.S. Cl.
USPC ............................ 324/318; 324/319; 324/322

(58) Field of Classification Search
USPC ............................ 324/300–322; 600/407–464
See application file for complete search history.

(56) References Cited

U.S. PATENT DOCUMENTS

| | | | |
|---|---|---|---|
| 6,552,545 B2 | 4/2003 | Kaindl et al. | |
| 7,135,863 B2 * | 11/2006 | Arik et al. | 324/318 |
| 7,397,244 B2 * | 7/2008 | Cirel | 324/318 |
| 7,463,029 B2 * | 12/2008 | Schuster et al. | 324/318 |
| 7,495,444 B2 * | 2/2009 | Schuster et al. | 324/318 |
| 7,570,058 B1 * | 8/2009 | Wong et al. | 324/318 |
| 7,589,531 B2 | 9/2009 | Yamashita et al. | |
| 8,188,741 B2 * | 5/2012 | Sakakura | 324/318 |
| 8,305,079 B2 * | 11/2012 | Iwasa et al. | 324/315 |
| 8,552,726 B2 * | 10/2013 | Sakakura | 324/318 |
| 2005/0035764 A1 * | 2/2005 | Mantone et al. | 324/318 |
| 2010/0085053 A1 | 4/2010 | Iwasa et al. | |

FOREIGN PATENT DOCUMENTS

JP 2006-311957 11/2006

OTHER PUBLICATIONS

U.S. Appl. No. 12/521,831, Yoshitomo Sakakura, filed Jun. 30, 2009.

* cited by examiner

*Primary Examiner* — Melissa Koval
*Assistant Examiner* — Emily Chan
(74) *Attorney, Agent, or Firm* — Nixon Vanderhye PC (57) ABSTRACT

In one embodiment, a magnetic resonance imaging apparatus includes a gradient coil, a first cooling pipe, and a second cooling pipe. The gradient coil applies a gradient magnetic field onto a subject placed in a static magnetic field. The first cooling pipe is provided in the gradient coil, and circulates a coolant in a certain direction. The second cooling pipe is provided in the gradient coil so as to be in parallel with the first cooling pipe, and circulates a coolant in an opposite direction to a direction in which the first cooling pipe circulates the coolant.

17 Claims, 7 Drawing Sheets

FIG.11

MAGNETIC RESONANCE IMAGING APPARATUS

CROSS-REFERENCE TO RELATED APPLICATIONS

This application is based upon and claims the benefit of priority from the prior Japanese Patent Application No. 2009-130953, filed on May 29, 2009; and Japanese Patent Application No. 2010-094217, filed on Apr. 15, 2010, the entire contents of both of which are incorporated herein by reference.

BACKGROUND

1. Field

Embodiments described herein relate generally to a magnetic resonance imaging apparatus.

2. Description of the Related Art

A magnetic resonance imaging apparatus is an apparatus that images an inside of a subject by using a magnetic resonance phenomenon. Such magnetic resonance imaging apparatus includes various units, such as a static magnetic-field magnet that generates a static magnetic field in a scan region, a gradient coil that applies a gradient magnetic field onto the subject placed in the static magnetic field, and a radio frequency coil that receives a magnetic resonance signal from the subject applied with the gradient magnetic field.

Among the various units, the gradient coil is repeatedly supplied with a pulse current while imaging, thereby generating heat to a large extent. Especially in recent years, a speedup in switching of a gradient magnetic field and an enhancement of the strength of a gradient magnetic field are strongly required along with a speedup in an imaging technology, so that heat generation by a gradient coil becomes more marked.

Heat generation by a gradient magnetic field has a possibility of giving influence on the quality of a taken image, or giving a pain to a subject to be imaged. For this reason, conventionally, various technologies for suppressing heat generation by a gradient coil while imaging have been invented. For example, a technology of cooling a gradient coil while imaging by circulating a coolant through cooling pipes provided inside the gradient coil has been proposed (for example, see JP-A 2006-311957 (KOKAI)).

However, according to conventional magnetic resonance imaging apparatuses, there is a problem that the gradient magnetic field cannot be uniformly cooled, as described below.

Specifically, according to the conventional technology described above, an inlet and an outlet of a cooling pipe is generally arranged on opposite sides in the gradient coil. During a period from flowing in from one side of the gradient coil until flowing out from the opposite side, a coolant flowing through the cooling pipe gradually rises in temperature by taking up heat generated by the gradient coil. Therefore, a difference is made in the temperature of the coolant between the vicinity of the inlet and the vicinity the outlet of the cooling pipe. As a result, a temperature gradient occurs in the cooling water flowing through inside the gradient magnetic field, so that the gradient coil cannot be uniformly cooled.

DETAILED DESCRIPTION

In one embodiment, a magnetic resonance imaging apparatus includes a gradient coil, a first cooling pipe, and a second cooling pipe. The gradient coil applies a gradient magnetic field onto a subject placed in a static magnetic field. The first cooling pipe is provided in the gradient coil, and circulates a coolant in a certain direction. The second cooling pipe is provided in the gradient coil so as to be in parallel with the first cooling pipe, and circulates a coolant in an opposite direction to the direction in which the first cooling pipe circulates the coolant.

Exemplary embodiments of a Magnetic Resonance Imaging apparatus (hereinafter, "MRI apparatus") will be explained below in detail with reference to the accompanying drawings. The following embodiments are explained below in a case where water (hereinafter, "cooling water") is used as a coolant for cooling a gradient coil.

Figure 1:
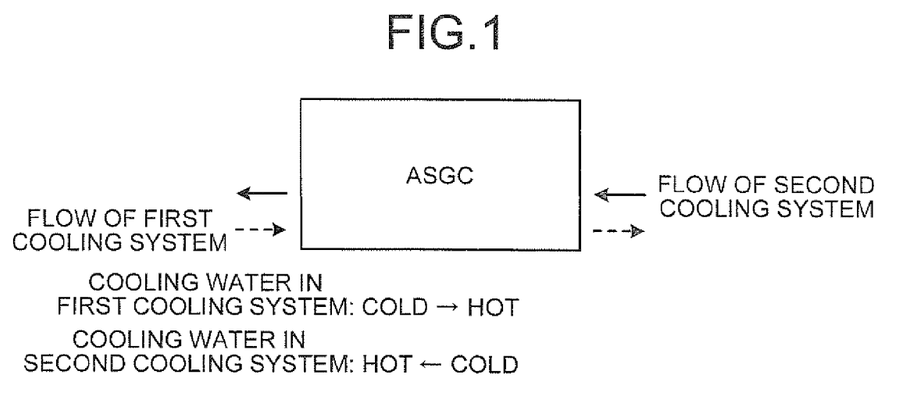
FIG. 1 is a schematic diagram for explaining an outline of a Magnetic Resonance Imaging (MRI) apparatus according to an embodiment.

First of all, an outline of an MRI apparatus according to an embodiment is explained below. FIG. 1 is a schematic diagram for explaining an outline of the MRI apparatus according to the embodiment. The MRI apparatus according to the embodiment includes a gradient coil that applies a gradient magnetic field onto a subject placed in a static magnetic field. According to the embodiment, the gradient coil is an Active Shield Gradient Coil (ASGC).

The gradient coil is provided with a first cooling system and a second cooling system each of which includes a plurality of cooling pipes that are arranged in parallel. According to the embodiment, as shown in FIG. 1, the first cooling system and the second cooling system are configured to circulate cooling water in opposite directions.

Accordingly, in the gradient coil, the temperature of cooling water flowing through the second cooling system becomes high at a location where the temperature of cooling water flowing through the first cooling system is low; by contrast, the temperature of cooling water flowing through the second cooling system becomes low at a location where the temperature of cooling water flowing through the first cooling system is high. Therefore, although heat is exchanged between the cooling pipes, the gradient coil as a whole does not bring about a state that the temperature of one side is high. As a result, occurrence of temperature gradient in cooling water can be prevented, so that the gradient magnetic field can be uniformly cooled.

Figure 2:
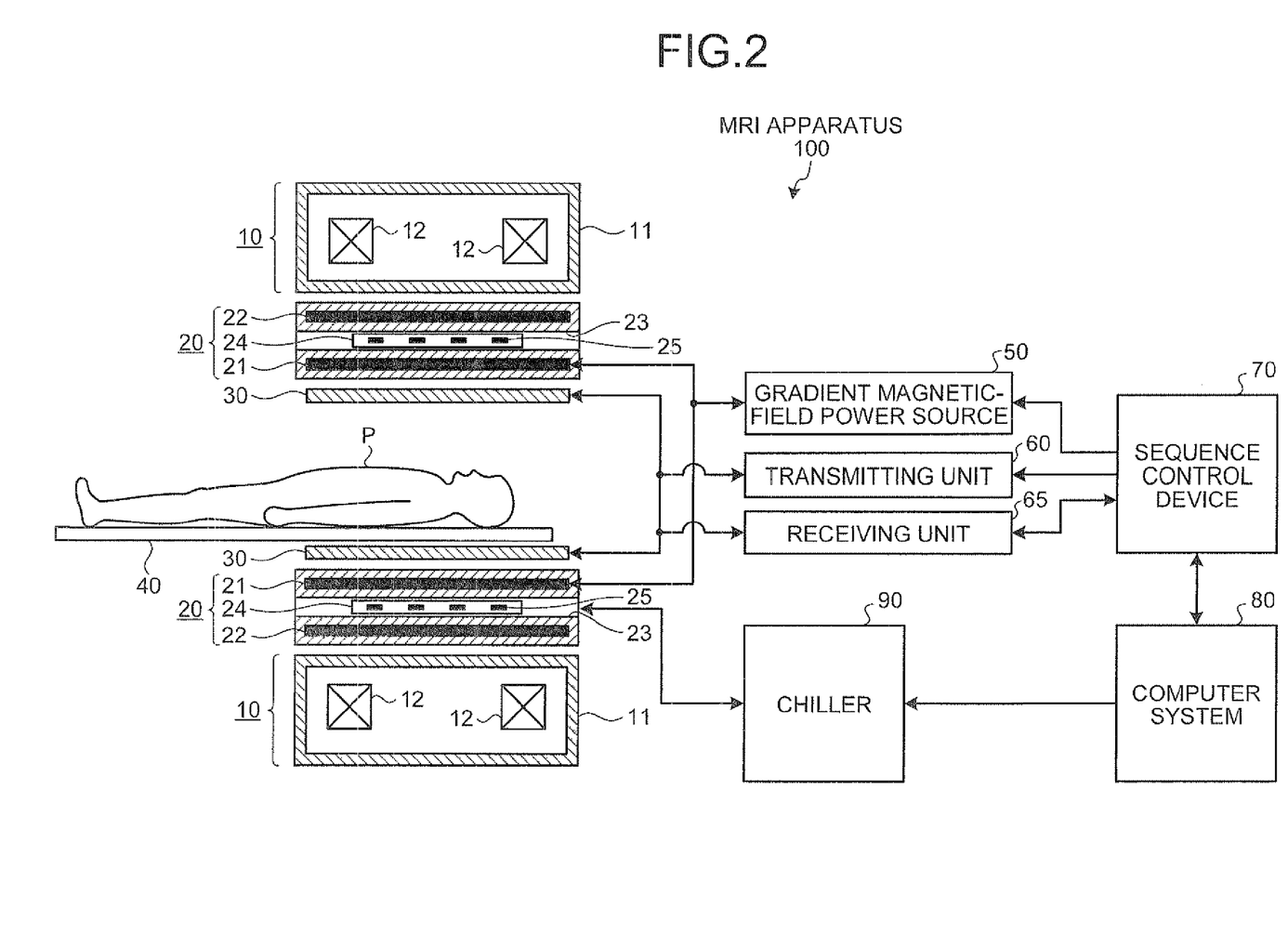
FIG. 2 is a schematic diagram of a configuration of the MRI apparatus according to the embodiment.

Then, a configuration of an MRI apparatus 100 according to the embodiment is explained below. FIG. 2 is a schematic diagram of a configuration of the MRI apparatus 100 according to the embodiment. As shown in the figure, the MRI apparatus 100 includes a static magnetic-field magnet 10, a gradient coil 20, a Radio Frequency (RF) coil 30, a couchtop 40, a gradient magnetic-field power source 50, a transmitting unit 60, a receiving unit 65, a sequence control device 70, a computer system 80, and a chiller 90.

The static magnetic-field magnet 10 includes a vacuum container 11 that is formed in a substantial drum shape, and superconducting coils 12 that are immersed in a cooling liquid in the vacuum container 11; and generates a static magnetic field inside a bore (a space inside the drum of the static magnetic-field magnet 10), which is an imaging area.

The gradient coil 20 is formed in a substantial drum shape, and provided on the inner side of the static magnetic-field magnet 10. The gradient coil 20 is includes a main coil 21 that applies gradient magnetic fields in directions of the x-axis, the y-axis, and the z-axis with a current supplied from the gradient magnetic-field power source 50; and a shield coil 22 that cancels a leaked magnetic field of the main coil 21.

Shim-tray insert guides 23 are formed between the main coil 21 and the shield coil 22. In each of the shim-tray insert guides 23, inserted is a shim tray 24 that accommodates therein iron shims 25 configured to correct ununiformity of a magnetic field inside the bore. A structure of the gradient coil 20 will be explained later in detail.

The RF coil 30 is anchored on the inner side of the gradient coil 20 on opposite sides of the subject P. The RF coil 30 radiates an RF pulse transmitted from the transmitting unit 60 onto the subject P, and receives a magnetic resonance signal emitted from the subject P by excitation of hydrogen nuclei.

The couchtop 40 is provided on a not-shown bed in a movable manner in the horizontal direction; and when performing a scan, the subject P is placed on the couchtop 40, and then the couchtop 40 is moved into the bore. The gradient magnetic-field power source 50 supplies power to the gradient coil 20 based on an instruction from the sequence control device 70.

The transmitting unit 60 transmits an RF pulse to the RF coil 30 based on an instruction from the sequence control device 70. The receiving unit 65 detects a magnetic resonance signal received by the RF coil 30, and transmits raw data obtained by digitizing the detected magnetic resonance signal, to the sequence control device 70.

The sequence control device 70 performs a scan of the subject P by activating the gradient magnetic-field power source 50, the transmitting unit 60, and the receiving unit 65, under the control of the computer system 80. As a result of performing the scan, when the raw data is transmitted from the receiving unit 65, the sequence control device 70 transmits the raw data to the computer system 80.

The computer system 80 controls the whole of the MRI apparatus 100. Specifically, the computer system 80 includes an input unit that receives various inputs from an operator; a sequence control unit that causes the sequence control device 70 to execute a scan based on imaging conditions input from the operator; an image reconstructing unit that reconstructs an image based on raw data transmitted from the sequence control device 70; a storage unit that stores, for example, a reconstructed image; a display unit that displays various information, such as the reconstructed image; and a main control unit that controls operations of each of functional units based on an instruction from the operator.

The chiller 90 supplies cooling water to the cooling pipes provided to the gradient coil 20. Specifically, the chiller 90 supplies cooling water to each of the first cooling system and the second cooling system included in the gradient coil 20. Here, the chiller 90 supplies cooling water to each of the cooling systems such that the direction of cooling water flowing through the first cooling system and the direction of cooling water flowing through the second cooling system are opposite to each other.

Figure 3:
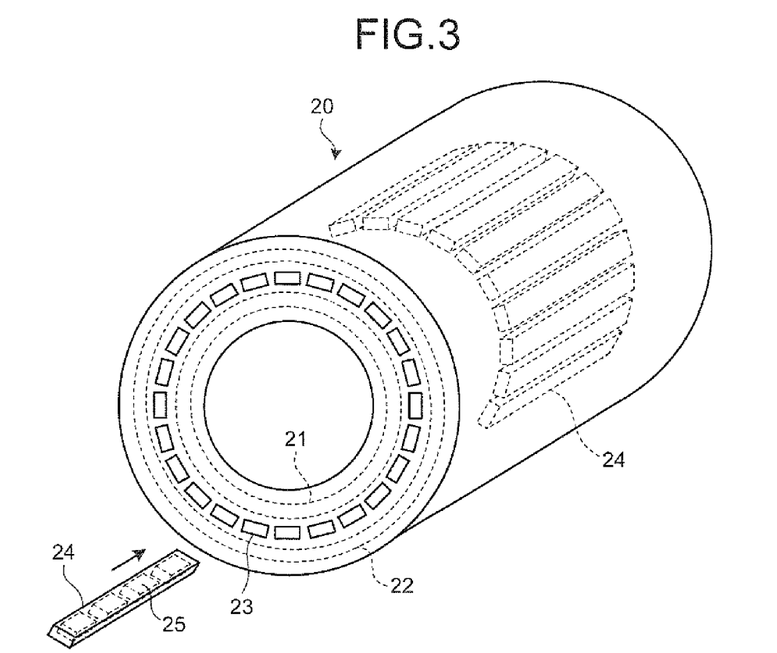
FIG. 3 is a perspective view of a structure of a gradient coil according to the embodiment.

A structure of the gradient coil 20 shown in FIG. 2 is explained below. FIG. 3 is a perspective view of a structure of the gradient coil 20 according to the embodiment. As shown in the figure, the gradient coil 20 includes the main coil 21 that is substantially in a drum shape, and the shield coil 22. The shim-tray insert guides 23 are formed between the two coils.

Each of the shim-tray insert guides 23 is a through hole that forms openings at both ends of the gradient coil 20, and is formed along the whole length in the longitudinal direction of the gradient coil 20. The shim-tray insert guides 23 are formed so as to be in parallel with each other with regular intervals in the circumferential direction in a region between the main coil 21 and the shield coil 22. The shim tray 24 is inserted in each of the shim-tray insert guides 23.

Each of the shim trays 24 is manufactured from a resin that is a non-magnetic and nonconductive material, and formed substantially in a stick shape. Each of the shim trays 24 accommodates a certain number of the iron shims 25. Each of the shim trays 24 is inserted into each of the shim-tray insert guides 23, and anchored in the central part of the gradient coil 20. Moreover, cooling pipes are embedded in the gradient coil 20 in a spiral fashion along the drum shape, although they are not shown in FIG. 3.

Figure 4:
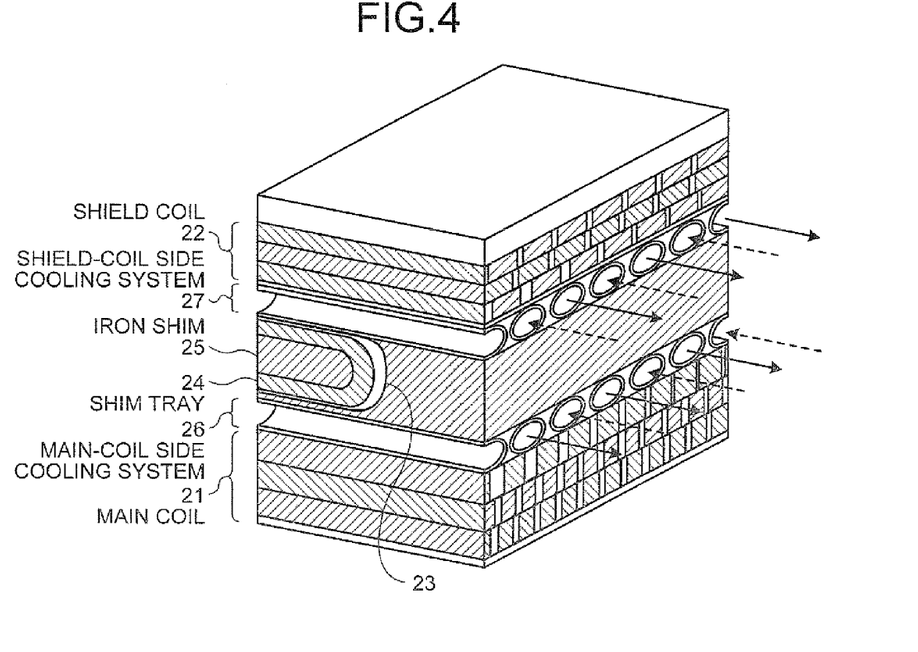
FIG. 4 is a structure diagram that depicts an internal structure of the gradient coil according to the embodiment.

FIG. 4 is a structure diagram that depicts an internal structure of the gradient coil 20. The figure depicts part of the gradient coil 20, the upper side of the figure depicts the outer side of the drum shape, and the lower side of the figure depicts the inner side of the drum shape.

As shown in FIG. 4, in the gradient coil 20, a main-coil side cooling system 26 is provided between the shim-tray insert guides 23 and the main coil 21. In addition, shield-coil side cooling system 27 is provided between the shim-tray insert guides 23 and the shield coil 22. Each of the main-coil side cooling system 26 and the shield-coil side cooling system 27 includes a plurality of cooling pipes that are embedded in a spiral fashion.

Specifically, the main-coil side cooling system 26 includes first cooling pipes and second cooling pipes that are provided to be in parallel with the first cooling pipes. The first cooling pipes circulate cooling water in a certain direction (the direction of a broken-line arrow shown in FIG. 4), and the second cooling pipes circulate cooling water in the opposite direction to the direction in which the first cooling pipes circulate cooling water (the direction of a solid-line arrow shown in FIG. 4). The shield-coil side cooling system 27 similarly includes first cooling pipes and second cooling pipes.

In other words, in the gradient coil 20, the main-coil side cooling system 26 is arranged between the main coil 21 and the iron shim 25, and the shield-coil side cooling system 27 is arranged between the shield coil 22 and the iron shim 25. The main-coil side cooling system 26 and the shield-coil side cooling system 27 are arranged on opposite sides of the iron shim 25. Accordingly, the iron shim 25 becomes resistant to conduction of heat generated by the main coil 21 and the shield coil 22.

Figure 5:
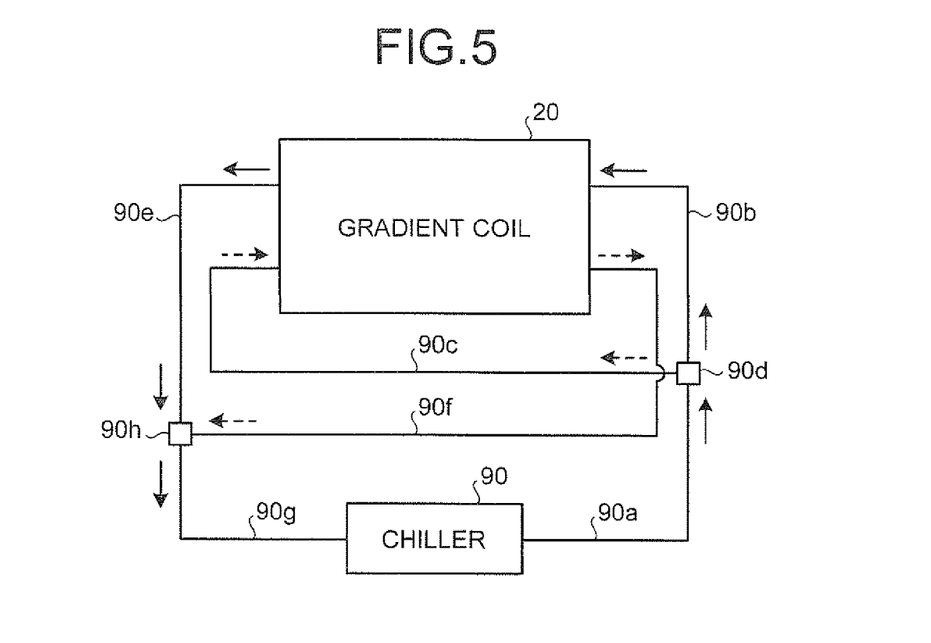
FIG. 5 is a schematic diagram that depicts circulation routes of cooling water in the MRI apparatus according to the embodiment.

Circulation routes of cooling water in the MRI apparatus 100 according to the embodiment are explained below. FIG. 5 is a schematic diagram that depicts circulation routes of cooling water in the MRI apparatus 100 according to the embodiment. As shown in FIG. 5, for example, the MRI apparatus 100 includes coolant supply pipes 90a, 90b, and 90c, and a valve 90d. One end of the coolant supply pipe 90a is connected to the chiller 90, and the other end is connected to the valve 90d. One end of the coolant supply pipe 90b is connected to the valve 90d, and the other end is connected to a lateral end of the gradient coil 20. One end of the coolant supply pipe 90c is connected to the valve 90d, and the other end is connected to a lateral end of the gradient coil 20. Here, the coolant supply pipe 90c is connected to the gradient coil 20 on the opposite side to the coolant supply pipe 90b.

Moreover, the MRI apparatus 100 includes coolant withdrawing pipes 90e, 90f, and 90g, and a valve 90h. One end of the coolant withdrawing pipe 90e is connected to a lateral side of the gradient coil 20, and the other end is connected to the valve 90h. One end of the coolant withdrawing pipe 90f is connected to a lateral side of the gradient coil 20, and the other end is connected to the valve 90h. In this case, the coolant withdrawing pipe 90f is connected to the gradient coil 20 on the opposite side to the coolant supply pipe 90e. One end of the coolant withdrawing pipe 90g is connected to the valve 90h, and the other end is connected to the chiller 90.

The coolant supply pipe 90a then flows cooling water supplied from the chiller 90 to the valve 90d. The valve 90d branches the flowing-in cooling water from the coolant supply pipe 90a into two flow routes, flows the cooling water of one of the flow routes into the coolant supply pipe 90b, and flows the cooling water of the other of the flow routes into the coolant supply pipe 90c. The coolant supply pipe 90b supplies the flowing-in cooling water from the valve 90d to the respective first cooling pipes of the main-coil side cooling system 26 and the shield-coil side cooling system 27. The coolant supply pipe 90c flows the flowing-in cooling water from the valve 90d into the respective second cooling pipes of the main-coil side cooling system 26 and the shield-coil side cooling system 27.

The coolant withdrawing pipe 90e flows the flowing-out cooling water from the respective first cooling pipes of the main-coil side cooling system 26 and the shield-coil side cooling system 27 to the valve 90h. The coolant withdrawing pipe 90f flows the flowing-out cooling water from the respective second cooling pipes of the main-coil side cooling system 26 and the shield-coil side cooling system 27 to the valve 90h. The valve 90h causes the flowing-in cooling water from the coolant withdrawing pipes 90e and 90f to join each other and flows it to the coolant withdrawing pipe 90g. The coolant withdrawing pipe 90g returns the flowing-in cooling water from the valve 90h to the chiller 90.

Accordingly, the cooling water is circulated through the respective first cooling pipes of the main-coil side cooling system 26 and the shield-coil side cooling system 27. In addition, cooling water is circulated through the respective second cooling pipes of the main-coil side cooling system 26 and the shield-coil side cooling system 27.

In this way, according to the embodiment, the coolant supply pipes 90a, 90b, and 90c branch a flow route of cooling water supplied from the chiller 90 into two flow routes; supplies cooling water flowing through one of the flow routes to the first cooling pipes from one lateral end of the gradient coil 20; and supplies cooling water flowing through the second flow routes to the second cooling pipes from the other lateral end of the gradient coil 20. In other words, according to the embodiment, the gradient coil 20 is supplied with cooling water into the first cooling system and the second cooling system from respective sides opposite to each other.

Figure 6:
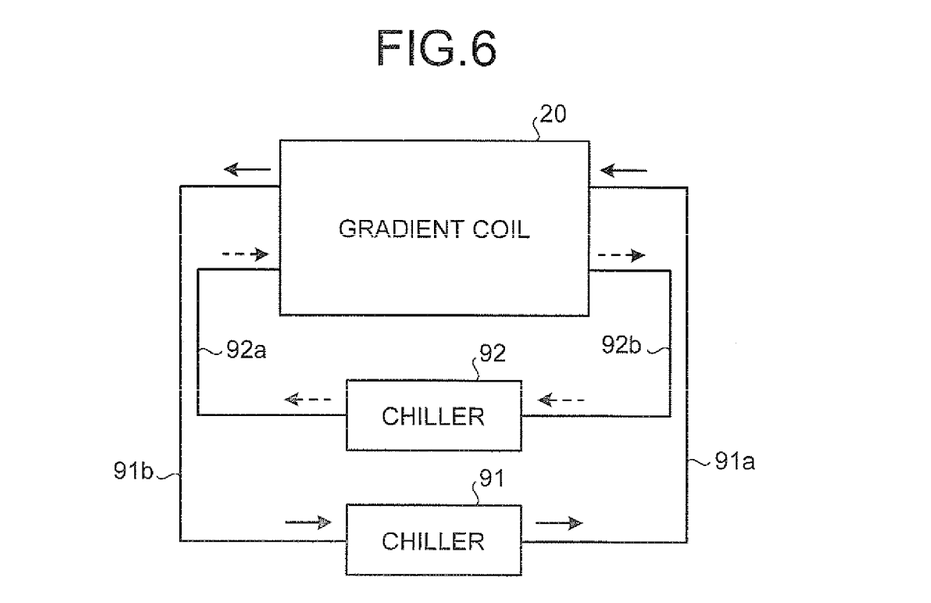
FIG. 6 is a schematic diagram that depicts another example of circulation routes of cooling water in the MRI apparatus according to the embodiment.

Circulation routes are not limited to these. FIG. 6 is a schematic diagram that depicts another example of circulation routes of cooling water in the MRI apparatus according to the embodiment. The example shown in FIG. 6 depicts a case there the MRI apparatus 100 includes two chillers 91 and 92. In this case, for example, the MRI apparatus 100 includes coolant supply pipes 91a and 92a, and coolant withdrawing pipes 91b and 92b.

One end of the coolant supply pipe 91a is connected to the chiller 91, and the other end is connected to a lateral side of the gradient coil 20. One end of the coolant supply pipe 92a is connected to the chiller 92, and the other end is connected to a lateral side of the gradient coil 20. Here, the coolant supply pipe 92a is connected to the gradient coil 20 on the opposite side to the coolant supply pipe 91a.

One end of the coolant withdrawing pipe 91b is connected to a lateral side of the gradient coil 20, and the other end is connected to the chiller 91. One end of the coolant withdrawing pipe 92b is connected to a lateral side of the gradient coil 20, and the other end is connected to the chiller 92. In this case, the coolant withdrawing pipe 92b is connected to the gradient coil 20 on the opposite side to the coolant withdrawing pipe 91b.

The coolant supply pipe 91a then flows cooling water supplied from the chiller 91 into the respective first cooling pipes of the main-coil side cooling system 26 and the shield-coil side cooling system 27. The coolant withdrawing pipe 91b returns the flowing-out cooling water from the respective first cooling pipes of the main-coil side cooling system 26 and the shield-coil side cooling system 27 to the chiller 91. Accordingly, the cooling water is circulated through the respective first cooling pipes of the main-coil side cooling system 26 and the shield-coil side cooling system 27.

The coolant supply pipe 92a flows cooling water supplied from the chiller 92 into the respective second cooling pipes of the main-coil side cooling system 26 and the shield-coil side cooling system 27. The coolant withdrawing pipe 92b returns the flowing-out cooling water from the respective second cooling pipes of the main-coil side cooling system 26 and the shield-coil side cooling system 27 to the chiller 92. Accordingly, the cooling water is circulated through the respective second cooling pipes of the main-coil side cooling system 26 and the shield-coil side cooling system 27.

In this way, for example, the chiller 91 supplies cooling water to the first cooling pipes from one lateral side of the gradient coil 20. The chiller 92 supplies cooling water to the second cooling pipes from the other lateral side of the gradient coil 20. Also according to this example, the gradient coil 20 is supplied with cooling water into the first cooling system and the second cooling system from respective sides opposite to each other.

An arrangement of the cooling pipes of the main-coil side cooling system 26 and the shield-coil side cooling system 27 is explained below. The arrangement of the cooling pipes in the main-coil side cooling system 26 is similar to the arrangement of the cooling pipes in the shield-coil side cooling system 27, therefore, the main-coil side cooling system 26 is explained below as an example.

Figure 7:
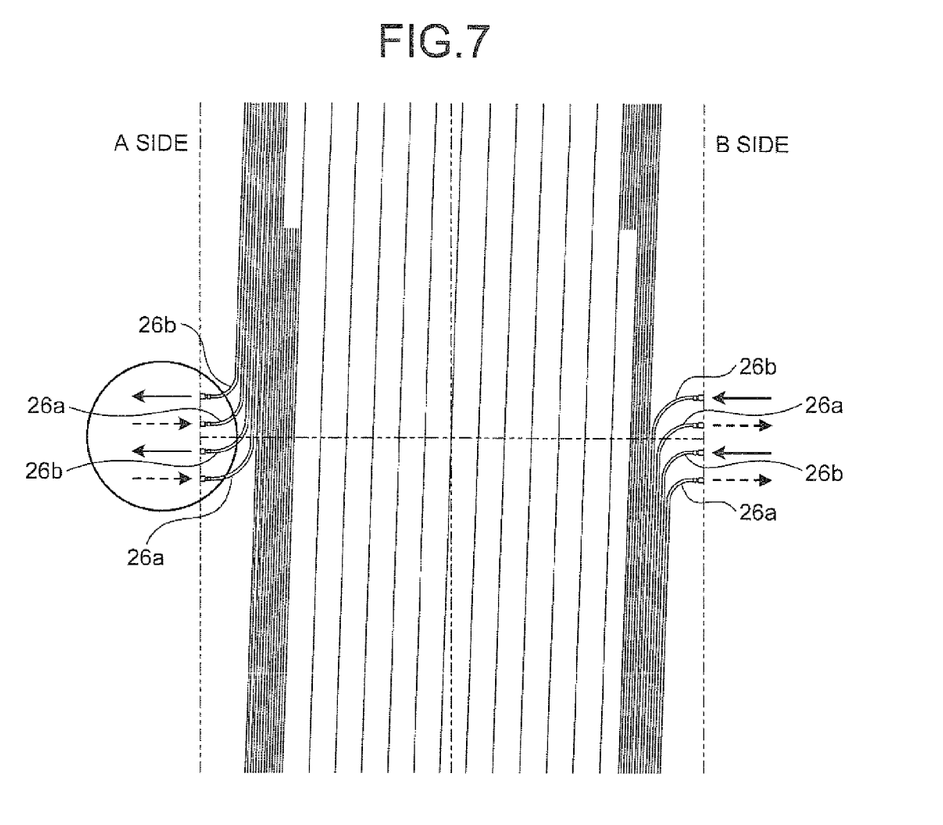
FIG. 7 is a schematic diagram that depicts an example of an arrangement of cooling pipes in a main-coil side cooling system of according to the embodiment.

FIG. 7 is a schematic diagram that depicts an example of an arrangement of the cooling pipes in the main-coil side cooling system 26 of the gradient coil 20 according to the embodiment. The figure depicts a case of using the first cooling pipes and the second cooling pipes two each. For example, as shown in the figure, first cooling pipes 26a and second cooling pipes 26b are alternately arranged in the main-coil side cooling system 26.

Although not shown in FIG. 7, inlets and outlets of respective cooling pipes are provided with respective manifolds (branch pipe). A manifold provided at the inlets (hereinafter, "inlet-side manifold") branches cooling water supplied from the chiller 90 into a certain number of branches, and flows the branched cooling water into each of the cooling pipes. A manifold provided at the outlets (hereinafter, "outlet-side manifold") causes cooling water flowing out from each of the cooling pipes to join each other, and sends the joined cooling water to the chiller 90.

Figure 8:
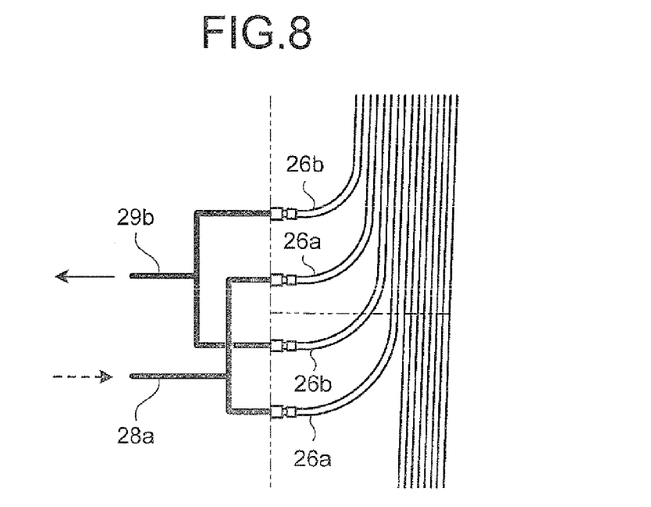
FIG. 8 is a schematic diagram that depicts an example of an inlet-side manifold and an outlet-side manifold according to the embodiment.

FIG. 8 is a schematic diagram that depicts an example of an inlet-side manifold and an outlet-side manifold according to the embodiment. The figure depicts the manifolds provided to the cooling pipes of the main-coil side cooling system 26 shown in FIG. 7. For example, as shown in FIG. 8, the main-coil side cooling system 26 is provided with an inlet-side manifold 28a at the inlets of the first cooling pipes 26a, and provided with an outlet-side manifold 29b at the outlets of the second cooling pipes 26b.

The inlet-side manifold 28a branches cooling water supplied from the chiller 90 into two, and flows the branched cooling water into each of the first cooling pipes 26a. Although not shown FIG. 8, an inlet-side manifold provided at the inlets of the second cooling pipes 26b also similarly branches cooling water supplied from the chiller 90 into two, and flows the branched cooling water into each of the second cooling pipes.

On the other hand, the outlet-side manifold 29b causes cooling water flowing out from each of the second cooling pipes 26b to join each other, and sends the joined cooling water to the chiller 90. Although not shown FIG. 8, an outlet-side manifold provided at the outlets of the first cooling pipes 26a also similarly causes cooling water flowing out from each of the first cooling pipes 26a to join each other, and sends the joined cooling water to the chiller 90.

Here, the pipe diameter of each cooling pipe, the length of each cooling pipe, and the number of branches of each manifold are each determined such that respective pressure losses in the cooling pipes are to be equal. For example, respective pipe diameters of the cooling pipes, respective lengths of the cooling pipes, and the respective numbers of branches of the manifolds are all made equal. Alternatively, for example, when the length of one of the cooling pipes is made shorter than the length of the other cooling pipes, the cooling pipe of which length is shorter is made to have a larger pipe diameter than the pipe diameter of the other cooling pipes so that respective pressure losses in the cooling pipes are made equal. Furthermore alternatively, for example, when the number of branches of one of the manifolds is made more than the number of branches of the other manifold, the cooling pipes connected to the manifold with more branches are made to be thinner in pipe diameter than the cooling pipes connected to the other manifold so that respective pressure losses in the cooling pipes are made equal. In this way, by making respective pressure losses in the cooling pipes equal, the flow rates of cooling water flowing through the respective cooling pipes are constant.

As described above, according to the embodiment, the first cooling pipes are provided in the gradient coil 20, and circulate a coolant in a certain direction. In addition, the second cooling pipes are provided in the gradient coil 20 so as to be in parallel with the first cooling pipes, and circulate a coolant in the opposite direction to the direction in which the first cooling pipes 26a circulate the coolant. Consequently, according to the embodiment, it can prevent occurrence of temperature gradient in cooling water, so that the gradient coil can be uniformly cooled.

Moreover, according to the embodiment, the first cooling pipes and the second cooling pipes are arranged between the main coil 21 and the iron shim 25, and between the shield coil 22 and the iron shim 25, respectively. Consequently, according to the embodiment, it can prevent occurrence of temperature gradient in the iron shim 25. It is known that a change in temperature of the iron shim 25 is to be a cause of a fluctuation in the uniformity of a magnetic field, resulting in influence on the image quality of an image to be taken. According to the embodiment, because it can prevent occurrence of temperature gradient in the iron shim 25, the uniformity of a magnetic field can be improved, so that an image with a stable image quality can be obtained.

Moreover, according to the embodiment, the first cooling pipes and the second cooling pipes are alternately arranged. Consequently, according to the embodiment, a temperature distribution of cooling water can be more uniform, so that the gradient coil can be cooled more uniformly.

Furthermore, according to the embodiment, the pipe diameter of each cooling pipe, the length of each cooling pipe, and the number of branches of each manifold are each determined such that respective pressure losses in the cooling pipes are to be equal. Consequently, according to the embodiment, the flow rates of cooling water flowing through the respective cooling pipes are constant, so that the gradient coil 20 can be uniformly cooled more precisely.

Although the embodiment is explained above in the case where the first cooling pipes and the second cooling pipes are alternately arranged, there may be another embodiment. For example, a group in which a plurality of first cooling pipes are arranged and another group in which a plurality of second cooling pipes are arranged can be arranged alternately.

Figure 9:
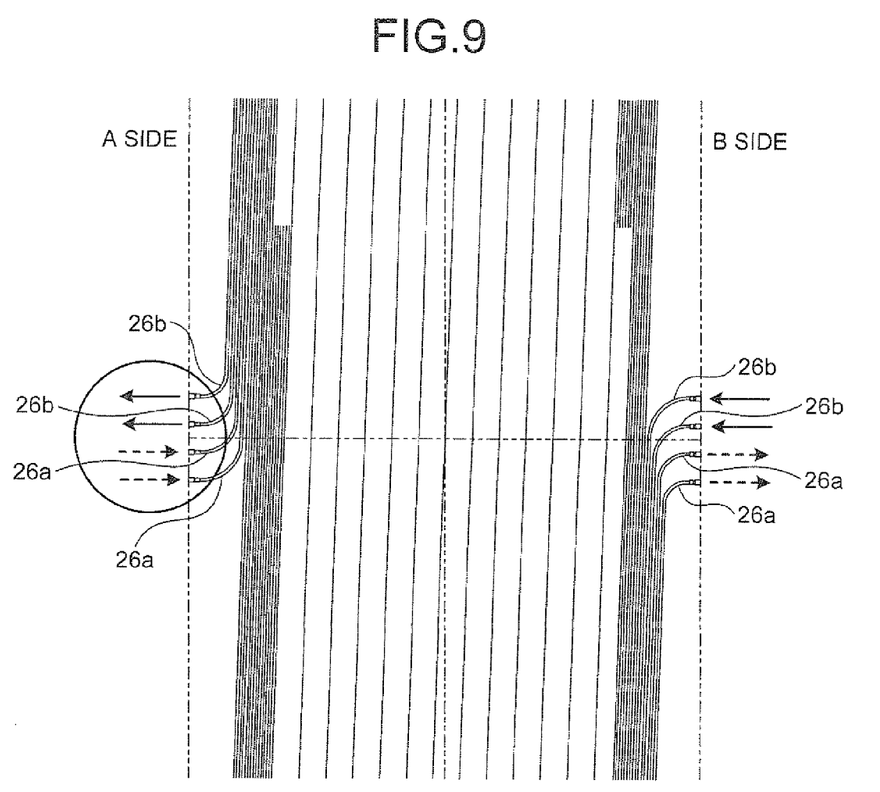
FIG. 9 is a schematic diagram that depicts another example of an arrangement of first cooling pipes and second cooling pipes according to the embodiment.

FIG. 9 is a schematic diagram that depicts another example of an arrangement of the first cooling pipes and the second cooling pipes according to the embodiment. The example is explained below also about the main-coil side cooling system 26. For example, as shown in FIG. 9, in the main-coil side cooling system 26, a pair in which two first cooling pipes are arranged and another pair in which two second cooling pipes are arranged can be arranged alternately. By making a group of a plurality of cooling pipes and arranging cooling pipes group by group, the cooling pipes will not cross one another at a manifold.

Figure 10:
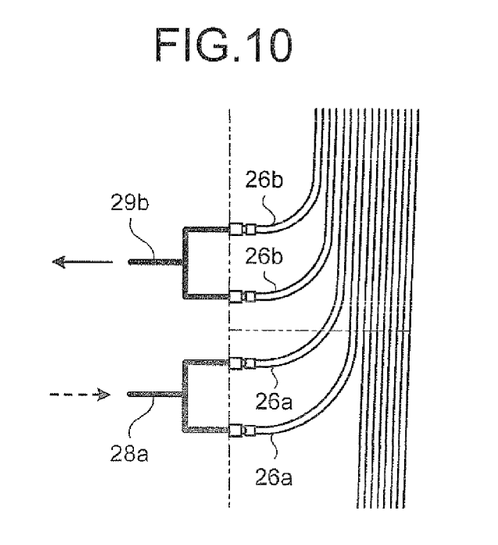
FIG. 10 is a schematic diagram that depicts another example of an inlet-side manifold and an outlet-side manifold according to the embodiment.

FIG. 10 is a schematic diagram that depicts another example of the inlet-side manifold 28a and the outlet-side manifold 29b according to the embodiment. The figure depicts the manifolds provided to the cooling pipes of the main-coil side cooling system 26 shown in FIG. 9. For example, as shown in FIG. 10, two of the first cooling pipes 26a are adjacently arranged, and two of the second cooling pipes 26b are adjacently arranged, so that the inlet-side manifold 28a and the outlet-side manifold 29b can be arranged without crossing each other. Accordingly, the cooling pipes can branch in a narrower space. Moreover, a smaller manifold can be used.

Furthermore, each manifold can be provided inside the gradient coil. Accordingly, the cooling pipes can branch in a much narrower space.

Moreover, according to the embodiment described above, it is assumed that the pipe diameter of each cooling pipe, the length of each cooling pipe, and the number of branches of each manifold are each determined such that respective pressure losses in the cooling pipes are to be equal. However, there may be another embodiment. For example, the pipe diameter of each cooling pipe, the length of each cooling pipe, and the number of branches of each manifold can be each determined such that a pressure loss in the cooling pipes included in the main-coil side cooling system 26 is to be smaller than that in the cooling pipes included in the shield-coil side cooling system 27. Accordingly, the flow ate of cooling water flowing through the main-coil side cooling system 26 can be higher than that of the shield-coil side cooling system 27. Because the main coil 21 generates heat more than the shield coil 22, cooling water can flow at a higher rate through the main-coil side cooling system 26, thereby cooling the gradient coil 20 more uniformly. Moreover, the gradient coil 20 can be efficiently cooled with a limited flow rate.

Figure 11:
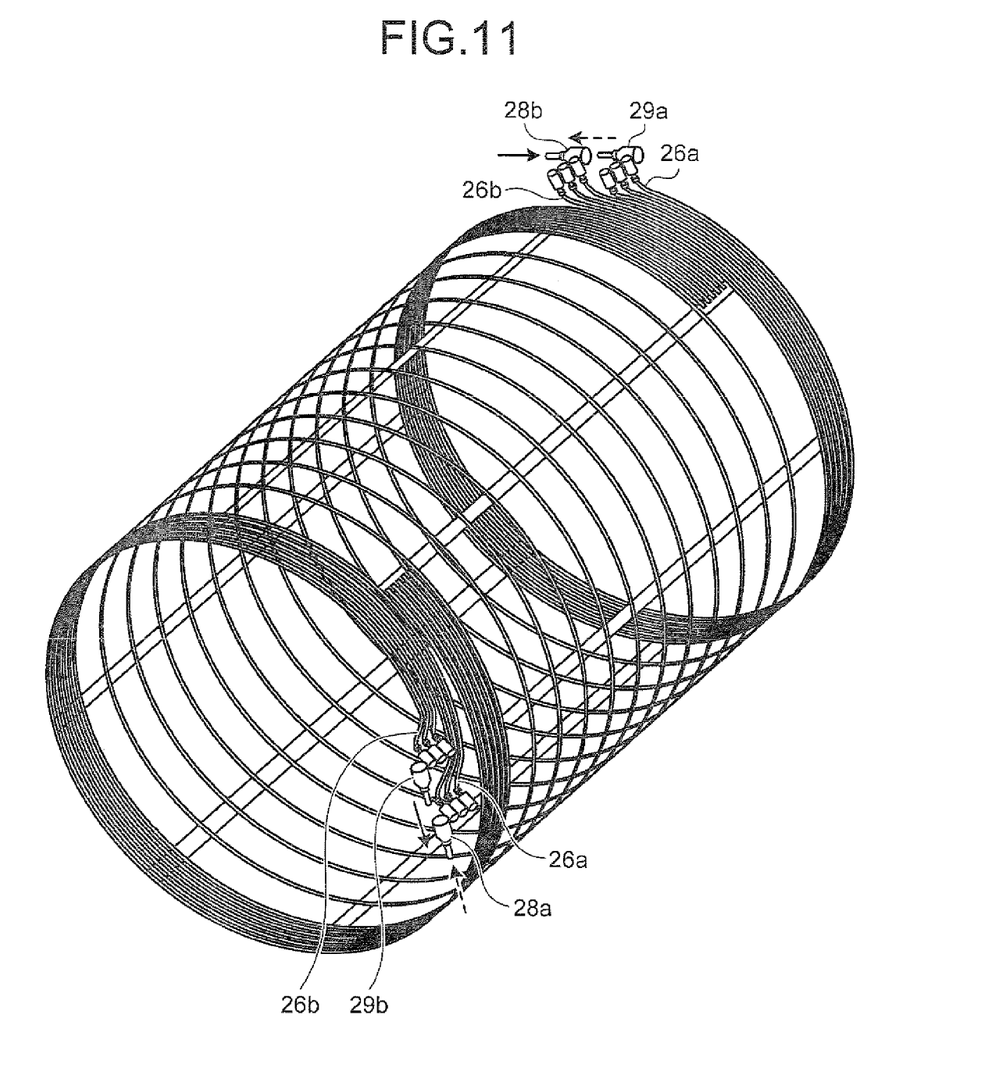
FIG. 11 is a schematic diagram that depicts an embodiment when using first cooling pipes and second cooling pipes three each.

Although the embodiment is explained above in the case of using the first cooling pipes and the second cooling pipes two each, there may be another embodiment. FIG. 11 is a schematic diagram that depicts an embodiment when using first cooling pipes and second cooling pipes three each. The figure depicts an arrangement of the first cooling pipes 26a and the second cooling pipes 26b in the main-coil side cooling system 26.

As shown in FIG. 11, when using the first cooling pipes 26a and the second cooling pipes 26b three each, the inlet-side manifold 28a branches cooling water into three, and flows the branched cooling water into each of the first cooling pipes 26a. An outlet-side manifold 29a causes the flowing-out cooling water from the first cooling pipes 26a to join each other, and sends the joined cooling water to the chiller 90. An inlet-side manifold 28b branches cooling water into three, and flows the branched cooling water into each of the second cooling pipes 26b. The outlet-side manifold 29b causes the flowing-out cooling water from the second cooling pipes 26b to join each other, and sends the joined cooling water to the chiller 90.

In this way, as the number of branches of cooling water is increased, the length of individual cooling pipes can be short, so that a pressure loss in each cooling pipe can be suppressed. As a result, the flow rate of cooling water can be increased; accordingly, the gradient coil 20 can be cooled more efficiently.

Moreover, although the embodiment is explained above in the case where the cooling pipes are arranged in a spiral fashion in the gradient coil 20, there may be another embodiment. For example, it can be applied to a case where cooling pipes are arranged in parallel along the longitudinal direction of the gradient coil 20.

While certain embodiments have been described, these embodiments have been presented by way of example only, and are not intended to limit the scope of the invention. Indeed, the novel apparatuses described herein may be embodied in a variety of other forms; furthermore, various omissions, substitutions and changes in form of the apparatuses described herein may be made without departing from the spirit of the invention. The accompanying claims and their equivalents are intended to cover such forms or modifications as would fall within the scope and spirit of the invention.

What is claimed is:

1. A magnetic resonance imaging apparatus comprising:
    a gradient coil that applies a gradient magnetic field onto a subject placed in a static magnetic field;
    a first cooling system that includes
        a first cooling pipe, and
        a first chiller that supplies a coolant to the first cooling pipe from a lateral side of the gradient coil;
    a second cooling system that includes
        a second cooling pipe, and
        a second chiller that supplies a coolant to the second cooling pipe from another lateral side of the gradient coil;
    wherein
    the first cooling pipe is provided in the gradient coil, and passes a coolant in a certain direction; and
    the second cooling pipe is provided in the gradient coil so as to be in parallel with the first cooling pipe, and passes a coolant through the second cooling pipe in an opposite direction to the direction in which the first cooling pipe passes the coolant.

2. The magnetic resonance imaging apparatus according to claim 1, wherein
    the gradient coil includes a coil that generates a certain magnetic field, and an iron shim that regulates uniformity of the static magnetic field, and
    the first cooling pipe and the second cooling pipe are each arranged between the coil and the iron shim.

3. The magnetic resonance imaging apparatus according to claim 2, wherein
    a plurality of first cooling pipes and a plurality of second cooling pipes are provided, and
    the first cooling pipes and the second cooling pipes are alternately arranged.

4. The magnetic resonance imaging apparatus according to claim 2, wherein
    a plurality of first cooling pipes and a plurality of second cooling pipes are provided, and
    a group in which the first cooling pipes are arranged and a group in which the second cooling pipes are arranged are alternately arranged.

5. The magnetic resonance imaging apparatus according to claim 2, wherein said cooling systems comprise:
    a chiller that supplies a coolant; and
    a coolant supply pipe that branches a flow route of the coolant supplied from the chiller into a first flow route and a second flow route, supplies a coolant flowing through the first flow route to the first cooling pipe from a lateral side of the gradient coil, and supplies a coolant flowing through the second flow route to the second cooling pipe from another lateral side of the gradient coil.

6. The magnetic resonance imaging apparatus according to claim 1, wherein
    a plurality of first cooling pipes and a plurality of second cooling pipes are provided, and
    the first cooling pipes and the second cooling pipes are alternately arranged.

7. The magnetic resonance imaging apparatus according to claim 6, further comprising:
    a first coolant branch pipe that branches a coolant into a certain number of branches, and flows branched coolant into the first cooling pipes; and
    a second coolant branch pipe that branches a coolant into a certain number of branches, and flows branched coolant into the second cooling pipes, wherein a pipe diameter of each cooling pipe, a length of each cooling pipe, and number of branches of each coolant branch pipe are each determined such that respective pressure losses in the first cooling pipes and respective pressure losses in the second cooling pipes are equal.

8. The magnetic resonance imaging apparatus according to claim 7, wherein
    the gradient coil includes
        a main coil and a shield coil, a main-coil side cooling system that includes the first cooling pipes and the second cooling pipes that are arranged in parallel along the main coil, and a shield-coil side cooling system that includes the first cooling pipes and the second cooling pipes that are arranged in parallel along the shield coil, and a pipe diameter of each cooling pipe, a length of each cooling pipe, and number of branches of each coolant branch pipe are each determined such that a pressure loss in cooling pipes included in the main-coil side cooling system is to be smaller than a pressure loss in cooling pipes included in the shield-coil side cooling system.

9. The magnetic resonance imaging apparatus according to claim 8, wherein the first coolant branch pipe and the second coolant branch pipe are each provided inside the gradient coil.

10. The magnetic resonance imaging apparatus according to claim 7, wherein the first coolant branch pipe and the second coolant branch pipe are each provided inside the gradient coil.

11. The magnetic resonance imaging apparatus according to claim 6, wherein said cooling systems comprise:
a chiller that supplies a coolant; and
a coolant supply pipe that branches a flow route of the coolant supplied from the chiller into a first flow route and a second flow route, supplies a coolant flowing through the first flow route to the first cooling pipe from a lateral side of the gradient coil, and supplies a coolant flowing through the second flow route to the second cooling pipe from another lateral side of the gradient coil.

12. The magnetic resonance imaging apparatus according to claim 1, wherein
a plurality of first cooling pipes and a plurality of second cooling pipes are provided, and
a group in which the first cooling pipes are arranged and a group in which the second cooling pipes are arranged are alternately arranged.

13. The magnetic resonance imaging apparatus according to claim 12, further comprising:
a first coolant branch pipe that branches a coolant into a certain number of branches, and flows branched coolant into the first cooling pipes; and
a second coolant branch pipe that branches a coolant into a certain number of branches, and flows branched coolant into the second cooling pipes, wherein a pipe diameter of each cooling pipe, a length of each cooling pipe, and number of branches of each coolant branch pipe are each determined such that respective pressure losses in the first cooling pipes and respective pressure losses in the second cooling pipes are equal.

14. The magnetic resonance imaging apparatus according to claim 13, wherein
the gradient coil includes a main coil and a shield coil, a main-coil side cooling system that includes the first cooling pipes and the second cooling pipes that are arranged in parallel along the main coil, and a shield-coil side cooling system that includes the first cooling pipes and the second cooling pipes that are arranged in parallel along the shield coil, and a pipe diameter of each cooling pipe, a length of each cooling pipe, and number of branches of each coolant branch pipe are each determined such that a pressure loss in cooling pipes included in the main-coil side cooling system is to be smaller than a pressure loss in cooling pipes included in the shield-coil side cooling system.

15. The magnetic resonance imaging apparatus according to claim 12, wherein said cooling systems comprise:
a chiller that supplies a coolant; and
a coolant supply pipe that branches a flow route of the coolant supplied from the chiller into a first flow route and a second flow route, supplies a coolant flowing through the first flow route to the first cooling pipe from a lateral side of the gradient coil, and supplies a coolant flowing through the second flow route to the second cooling pipe from another lateral side of the gradient coil.

16. The magnetic resonance imaging apparatus according to claim 1, wherein said cooling systems comprise:
a chiller that supplies a coolant; and
a coolant supply pipe that branches a flow route of the coolant supplied from the chiller into a first flow route and a second flow route, supplies a coolant flowing through the first flow route to the first cooling pipe from a lateral side of the gradient coil, and supplies a coolant flowing through the second flow route to the second cooling pipe from another lateral side of the gradient coil.

17. A magnetic resonance imaging apparatus comprising:
a gradient magnetic field coil that applies a gradient magnetic field onto a subject placed in a static magnetic field;
a first cooling pipe that is provided in the gradient coil, and passes a coolant in a certain direction through the first cooling pipe;
a second cooling pipe that is provided in the gradient coil so as to be in parallel with the first cooling pipe, and passes a coolant through the second cooling pipe in an opposite direction to the direction in which the first cooling pipe passes the coolant;
a first chiller that supplies a coolant to the first cooling pipe from a lateral side of the gradient coil; and
a second chiller that supplies a coolant to the second cooling pipe from another lateral side of the gradient coil,
wherein each of the first and second cooling pipes is arranged in a spiral fashion along the gradient coil.

* * * * *